(12) United States Patent
Kinge et al.

(10) Patent No.: US 10,826,005 B2
(45) Date of Patent: Nov. 3, 2020

(54) ATOMIC LAYER DEPOSITION OF LEAD SULFIDE FOR INFRARED OPTOELECTRONIC DEVICES

(71) Applicants: TOYOTA MOTOR EUROPE, Brussels (BE); THE GOVERNING COUNCIL OF THE UNIVERSITY OF TORONTO, Toronto (CA)

(72) Inventors: Sachin Kinge, Steenokkerzeel (BE); Jixian Xu, Toronto (CA); Brandon Sutherland, Mississauga (CA); Sjoerd Hoogland, Toronto (CA); Edward Sargent, Toronto (CA)

(73) Assignees: TOYOTA MOTOR EUROPE, Brussels (BE); THE GOVERNING COUNCIL OF THE UNIVERSITY OF TORONTO, Toronto (CA)

(*) Notice: Subject to any disclaimer, the term of this patent is extended or adjusted under 35 U.S.C. 154(b) by 0 days.

(21) Appl. No.: 15/763,290

(22) PCT Filed: Sep. 24, 2015

(86) PCT No.: PCT/EP2015/072030
§ 371 (c)(1),
(2) Date: Mar. 26, 2018

(87) PCT Pub. No.: WO2017/050382
PCT Pub. Date: Mar. 30, 2017

(65) Prior Publication Data
US 2018/0309076 A1 Oct. 25, 2018

(51) Int. Cl.
H01L 51/42 (2006.01)
H01L 31/032 (2006.01)
H01L 31/0352 (2006.01)

(52) U.S. Cl.
CPC ...... *H01L 51/4293* (2013.01); *H01L 31/0324* (2013.01); *H01L 31/035227* (2013.01); *H01L 51/4233* (2013.01); *Y02E 10/549* (2013.01)

(58) Field of Classification Search
CPC ............. H01L 51/4293; H01L 51/4233; H01L 31/0324; H01L 31/035227; Y02E 10/549
See application file for complete search history.

(56) References Cited

U.S. PATENT DOCUMENTS 8,455,757 B2 * 6/2013 Wang .................. H01L 51/4213
136/263
2009/0038677 A1 * 2/2009 Su .......................... H01L 31/18
136/252

(Continued)

FOREIGN PATENT DOCUMENTS

CN 101894914 A 11/2010
TW 201332134 A 8/2013

OTHER PUBLICATIONS

Thomas P. Brennan et al., "Supplementary Information, Efficiency enhancement of solid-state PbS quantum dot-sensitized solar cells with Al2O3 barrier layer", Electronic Supplementary Material (ESI) for Jornal of Materials Chemistry A, 2013.

(Continued)

*Primary Examiner* — Su C Kim
(74) *Attorney, Agent, or Firm* — Oliff PLC

(57) ABSTRACT

A PIN type infrared photodiode including a first electrode, a n-type semiconductor, an atomic layer deposition coating of lead sulfide, a p-type semiconductor and a second electrode, wherein the n-type semiconductor comprises nanowires conformally coated with the atomic layer deposition coating of lead sulfide.

14 Claims, 4 Drawing Sheets

(56) References Cited

U.S. PATENT DOCUMENTS

| | | | | |
|---|---|---|---|---|
| 2010/0275985 A1* | 11/2010 | Zheng | ............... | H01L 51/4226 136/256 |
| 2013/0149860 A1* | 6/2013 | Dasgupta | ............ | H01L 31/0224 438/660 |
| 2013/0186460 A1* | 7/2013 | Chen | .................. | B82Y 20/00 136/256 |

OTHER PUBLICATIONS

Neil P. Dasgupta et al., "Atomic Layer Deposition of Lead Sulfide Quantum Dots on Nanowire Surfaces", ACS Publications, American Chemical Society, Nano Letters, pp. 934-940, 2011.

Oct. 31, 2019 Office Action issued in Chinese Patent Application No. 201580082903.1.

Jun. 24, 2016 International Search Report issued in International Patent Application No. PCT/EP2015/072030.

Joel Jean et al. "ZnO Nanowire Arrays for Enhanced Photocurrent in PbS Quantum Dot Solar Cells", Advanced Materials, vol. 25, No. 20, pp. 2790-2796, 2013.

Neil P. Dasgupta et al., "Atomic Layer Deposition of Lead Sulfide Quantum Dots on Nanowire Surfaces", Nano Letters, vol. 11, No. 3, pp. 934-940, 2011.

Jianjun Tian et al., "ZnO/TiO 2 nanocable structured photoelectrodes for CdS/CdSe quantum dot co-sensitized solar cells", Nanoscale, vol. 5, No. 3, pp. 936-943, 2012.

Kishorkumar V. Khot et al., "Synthesis, characterization and photoelectrochemical properties of PbS sensitized vertically aligned ZnO nanorods: modified aqueous route", Journal of Materials Science: Materials in Electronics., vol. 26, No. 9, pp. 6897-6906, 2015.

Sarah Kim et al., "Lead Sulfide Nanocrystal Quantum Dot Solar Cells with Trenched ZnO Fabricated via Nanoimprinting", ACS Applied Materials and Interfaces, vol. 5, No. 9, pp. 3803-3808, 2013.

Jun. 24, 2016 Written Opinion issued in International Patent Application No. PCT/EP2015/072030.

\* cited by examiner

ATOMIC LAYER DEPOSITION OF LEAD SULFIDE FOR INFRARED OPTOELECTRONIC DEVICES

FIELD OF THE DISCLOSURE

The present disclosure is related to optoelectronic devices, and more particularly to an infrared photodiode.

BACKGROUND OF THE DISCLOSURE

A PIN type photodiode device generally comprises a p-type and a n-type semiconductor separated by an intrinsic semiconductor as well as two electrodes.

Commercial PIN type photodiodes have remained expensive due to high temperature and high vacuum process steps for example.

Lead sulfide is a known intrinsic semiconductor commonly used in infrared detectors but it is generally epitaxially grown using chemical vapour deposition or molecular beam epitaxy, both techniques requiring high temperature and/or high vacuum.

It is known to deposit, by atomic layer deposition (ALD) techniques, quantum dots of lead sulfide (PbS) on nanoporous anastase ($TiO_2$) particles (T. P. Brennan et al., J. Mater. Chem. A., 2013, 1, 7566) or quantum dots of lead sulfide on silicon nanowires (N. P. Dasgupta et al., Nano Left. 2011, 11, 934-940), these applications are limited to solar cells applications.

SUMMARY OF THE DISCLOSURE

Currently, it remains desirable to provide a PIN type photodiode that is produced by a cheaper process. For example, the inventors of the present application have recognized that it is desirable to use processes that do not involve high temperature and high vacuum.

Therefore, according to embodiments of the present disclosure, a PIN type infrared photodiode is provided. The PIN type infrared photodiode includes a first electrode, a n-type semiconductor, an atomic layer deposition coating of lead sulfide, a p-type semiconductor and a second electrode, wherein the n-type semiconductor comprises nanowires conformally coated with the atomic layer deposition coating of lead sulfide.

By providing such a configuration, the intrinsic semiconductor of the PIN type photodiode, which is the lead sulfide coating, is deposited onto the nanowires by atomic layer deposition and therefore use of high temperature and high vacuum can be avoided.

The lead sulfide content of the coating is at least 95 wt %.

Atomic layer deposition is a thin film deposition method in which a film is grown on a substrate by exposing the surface of the substrate to alternate gaseous species, typically referred to as precursors. The precursors are inserted in the reactor as a series of sequential non-overlapping pulses. The temperature within the reactor is generally below 300° C., even below 200° C. The atomic layer deposition is considered a low temperature and low vacuum method for producing thin films and therefore a cheaper method than chemical vapour deposition for example.

Atomic layer deposition is also a method that allows depositing a conformal coating on a substrate, i.e., a coating having grown equally on all sides of the substrate. Thus, the coating will have a constant thickness and will uniformly coat the nanowires.

Moreover, atomic layer deposition also allows for a good control of the thickness of the layer deposited as well as uniform deposition over a large area.

Because the n-type semiconductor comprises nanowires, the contact surface between the n-type semiconductor and the coating of lead sulfide is relatively large. As the coating of lead sulfide is conformal on the nanowires, the contact surface between the p-type semiconductor and the coating of lead sulfide is also relatively large. Thus, the photodiode can be of overall reduced size and still exhibit good infrared absorption properties. Moreover, the use of nanowires as substrate for the coating of lead sulfide helps enhance the collection efficiency of light in the infrared range, which has a longer absorption length.

The nanowires may comprise zinc oxide.

The zinc oxide is a wide bandgap semiconductor with good transparency, high electron mobility and strong room temperature luminescence. Thus, it is a good material for growing nanowires. The zinc oxide content of the nanowires is at least 95 wt %.

The nanowires may comprise tin oxide or titanium oxide.

The PIN type infrared photodiode may comprise a coating of titanium dioxide interposed between the nanowires and the coating of lead sulfide, the coating of titanium dioxide conformally coating the nanowires.

The coating of titanium dioxide forms an improved adhesion surface for the lead sulfide on the nanowires. The content of titanium dioxide of the coating is at least 95 wt %.

The PIN type infrared photodiode may comprise a coating of aluminum oxide, hafnium oxide, zirconium oxide or tin oxide interposed between the nanowires and the coating of lead sulfide, the coating of aluminum oxide, hafnium oxide, zirconium oxide or tin oxide conformally coating the nanowires.

The p-type semiconductor may comprise spiro-MeOTAD.

Spiro-MeOTAD is a solid p-type semiconductor. P-type semiconductors are also called hole transport materials. The use of a solid p-type semiconductor instead of liquid type hole transport material eliminates concerns over device sealing and corrosion by the liquid. The spiro-MeOTAD content of the p-type semiconductor is at least 95 wt %.

The p-type semiconductor may comprise poly[bis(4-phenyl)(2,4,6-trimethylphenyl)amine] (PTAA).

The first electrode may comprise fluorine-doped tin oxide.

Such a substrate is easy to produce, transparent and a good electrical conductor. The fluorine-doped tin oxide content of the first electrode is at least 95 wt %.

The first electrode may comprise indium-doped tin oxide.

The coating of lead sulfide may have a thickness equal to or greater than 5 nm, preferably equal to or greater than 10 nm, more preferably equal to or greater than 15 nm.

Indeed, the quantity of infrared light absorption in the PIN type infrared photodiode increases with the thickness of the PbS film.

The thickness of the lead sulfide coating may have a thickness less than or equal to 40, preferably less than or equal to 35, more preferably less than or equal to 30.

Transport of carriers through the PbS layer in the PIN type infrared photodiode decreases with the thickness the PbS film.

The present disclosure also relates to a method for producing a PIN infrared photodiode, the method including the following steps:

growing nanowires of a p-type semiconductor; and
conformally coating the nanowires with lead sulfide by atomic layer deposition.

In this method, the nanowires may comprise zinc oxide and before conformally coating the nanowires with lead sulfide, the nanowires may be conformally coated with titanium dioxide by atomic layer deposition.

The nanowires may be grown on a fluorine-doped tin oxide substrate.

The lead sulfide may be deposited from lead bis(2,2,6,6-tetramethyl-3,5-heptadionate) and hydrogen sulfide precursors.

These precursors are simple to obtain.

A number of cycles for the deposition of the lead sulfide may be is equal to or greater than 10 cycles, preferably equal to or greater than 30 cycles, more preferably equal to or greater than 50 cycles.

A number of cycles for the deposition of the lead sulfide may be is less than or equal to 110 cycles, preferably less than or equal to 90 cycles, more preferably less than or equal to 70 cycles. The nanowires may be grown from a liquid solution at a temperature below 600° C.

Thus, the step of growing the nanowires is also a low temperature process and it does not involve high pressure or high vacuum.

It is intended that combinations of the above-described elements and those within the specification may be made, except where otherwise contradictory.

It is to be understood that both the foregoing general description and the following detailed description are exemplary and explanatory only and are not restrictive of the disclosure, as claimed.

The accompanying drawings, which are incorporated in and constitute a part of this specification, illustrate embodiments of the disclosure and together with the description, serve to explain the principles thereof.

DESCRIPTION OF THE EMBODIMENTS

Reference will now be made in detail to exemplary embodiments of the disclosure, examples of which are illustrated in the accompanying drawings. Wherever possible, the same reference numbers will be used throughout the drawings to refer to the same or like parts.

Figure 1:
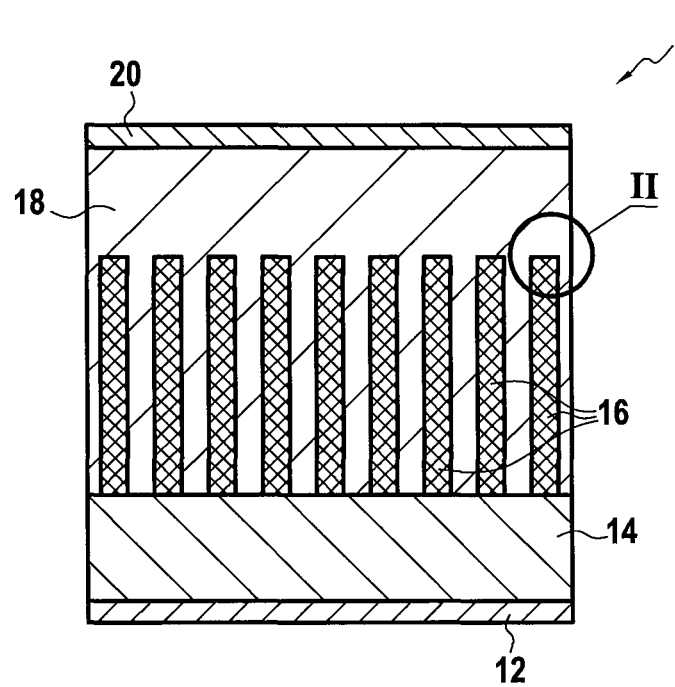
FIG. 1 shows a PIN type infrared photodiode according to embodiments of the present disclosure.

FIG. 1 shows a representation of an exemplary PIN type infrared photodiode 10.

From bottom to top, the PIN type infrared photodiode 10 comprises a glass substrate 12, a first electrode 14, nanowires 16 forming a n-type semiconductor, a p-type semiconductor 18 and a second electrode 20.

In the PIN type infrared photodiode 10 of FIG. 1, the first electrode 14 comprises fluorine-doped tin oxide deposited onto the glass substrate 12. The nanowires 16 were grown onto the first electrode 14. The nanowires 16 may comprise zinc oxide.

Figure 2:
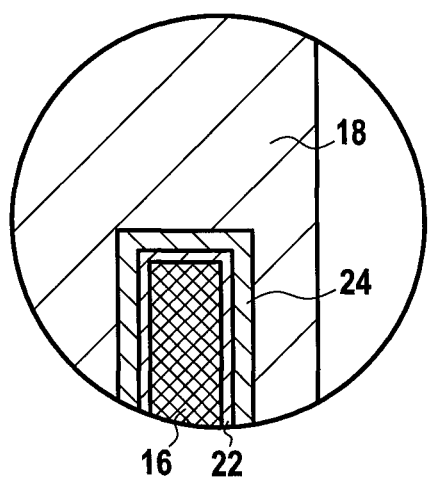
FIG. 2 shows a partial enlargement of FIG. 1.

Referring to FIG. 2, the nanowires 16 are coated with a conformal coating of titanium dioxide 22 and a conformal coating of lead sulfide 24, the coating of titanium dioxide 22 being sandwich between the nanowires 16 and the coating of lead sulfide 24.

The p-type semiconductor 18 comprises spiro-MeOTAD and the second electrode 20 comprises gold and silver.

The PIN type infrared photodiode 10 is produced by depositing the first electrode 14 on the glass substrate 12 and then growing the nanowires 16 on the first electrode 14.

The nanowires 16 are coated by atomic layer deposition with a conformal coating of lead sulfide 24, i.e., the intrinsic semiconductor. In the example below, before coating the nanowires 16 with a conformal coating of lead sulfide 24, the nanowires 16 are coated by atomic layer deposition with a conformal coating of titanium dioxide 22.

Then the p-type semiconductor 18 is applied onto the conformally coated nanowires 16 and the second electrode 20 is applied.

EXAMPLE

An exemplary PIN type infrared photodiode 10 was produced.

Nanowires 16 were grown on fluorine-doped tin oxide substrate deposited on a glass layer 12.

The seed layer of zinc oxide for the nanowires was deposited by spin-casting of 0.005 M zinc acetate solution on the fluorine-doped tin oxide substrate. The substrate was then annealed for 20 minutes at 400° C.

The growing of the nanowires has taken place in an aqueous solution containing 0.025 M of zinc nitrate hydrate and 0.025 M of hexamethylenetetramine, the substrate being held vertically in the aqueous solution.

The substrate was then dried in air for 4 hours at 60° C.

The substrate carrying the nanowires 16 was subsequently transferred into an atomic layer deposition chamber (Cambridge Nanotech Savannah S100) at 150° C. with a nitrogen carrier gas at a volumetric flow rate of 10 sccm (standard cubic centimetres per minute).

The titanium dioxide coating was deposited starting from tetrakis-dimethyl-amido titanium and water vapour precursors. The pulse duration for the tetrakis-dimethyl-amido titanium was 0.02 second and the pulse duration for the water vapour was 0.015 second. Between each pulse, a purge time of 20 seconds was set.

A cycle for depositing titanium dioxide comprises a first pulse of 0.02 seconds during which tetrakis-dimethyl-amido titanium is introduced into the reaction chamber and is adsorbed onto the surface of the nanowires, a purge of 20 seconds to remove the excess tetrakis-dimethyl-amido titanium, a second pulse of 0.015 seconds during which water vapour is introduced into the reaction chamber and is adsorbed onto the layer of tetrakis-dimethyl-amido titanium and reacts with it to produce titanium dioxide, and finally a purge of 20 seconds to remove the excess water vapour.

In this example, the titanium dioxide coating was deposited by running 20 cycles as described above.

Without breaking the low vacuum in the chamber, the lead sulfide coating was deposited starting from lead bis(2,2,6,6-tetramethyl-3,5-heptadionate) and hydrogen sulfide precursors. The pulse duration for both the lead bis(2,2,6,6- tetramethyl-3,5-heptadionate) and the hydrogen sulfide was 0.5 seconds. Between, each pulse, a purge time of 20 seconds was set.

A cycle for depositing lead sulfide dioxide comprises a first pulse of 0.5 second during which lead bis(2,2,6,6-tetramethyl-3,5-heptadionate) is introduced into the reaction chamber and is adsorbed onto the surface of the titanium dioxide coating, a purge of 20 seconds to remove the excess lead bis(2,2,6,6-tetramethyl-3,5-heptadionate), a second pulse of 0.5 second during which hydrogen sulfide is introduced into the reaction chamber and is adsorbed onto the layer of lead bis(2,2,6,6-tetramethyl-3,5-heptadionate) and reacts with it to produce lead sulfide, and finally a purge of 20 seconds to remove the excess hydrogen sulfide.

In this example, the lead sulfide coating was deposited by running 60 cycles as described above.

The substrate with the coated nanowires was then cooled down at room temperature and transferred to a glovebox.

The p-type semiconductor, i.e., the hole transporting material was formed from spiro-MeOTAD dissolved in chlorobenzene at 63 mg/mL and doped with tert-butylpyridine at 20 µL/mL and acetonitrile solution at 70 µL/mL containing bis(trifluoromethane)sulfonimide lithium salt at 170 mg/mL.

The solution was spin-casted at 4000 rpm (round per minute) for 60 second in the glovebox containing dry air.

The second electrode was deposited through a shadow mask in an thermal evaporation system (Angstrom Engineering Amod) contained in a glovebox (Innovative Technology). First, a 50 nm thick layer of gold was deposited at a rate of 1.5 Å·s$^{-1}$ by ebeam evaporation and a 100 nm thick layer of silver was then deposited at a rate of 1.5 Å·s$^{-1}$ by thermal evaporation.

As non-limitative example, the PIN type infrared photodiode 10 is a right circular cylinder having a height of is approximately 1.5 µm and a disc surface of approximately 0.07 cm$^2$ (3 mm in diameter). The thickness of the fluorine-doped tin oxide substrate is approximately 300 nm, the thickness of the spiro-MeOTAD is approximately 200 nm, and the thickness of the second electrode is approximately 150 nm. The thickness of the titanium dioxide coating is approximately 1 nm and the thickness of the lead sulfide coating is approximately 25 nm.

Figure 3:
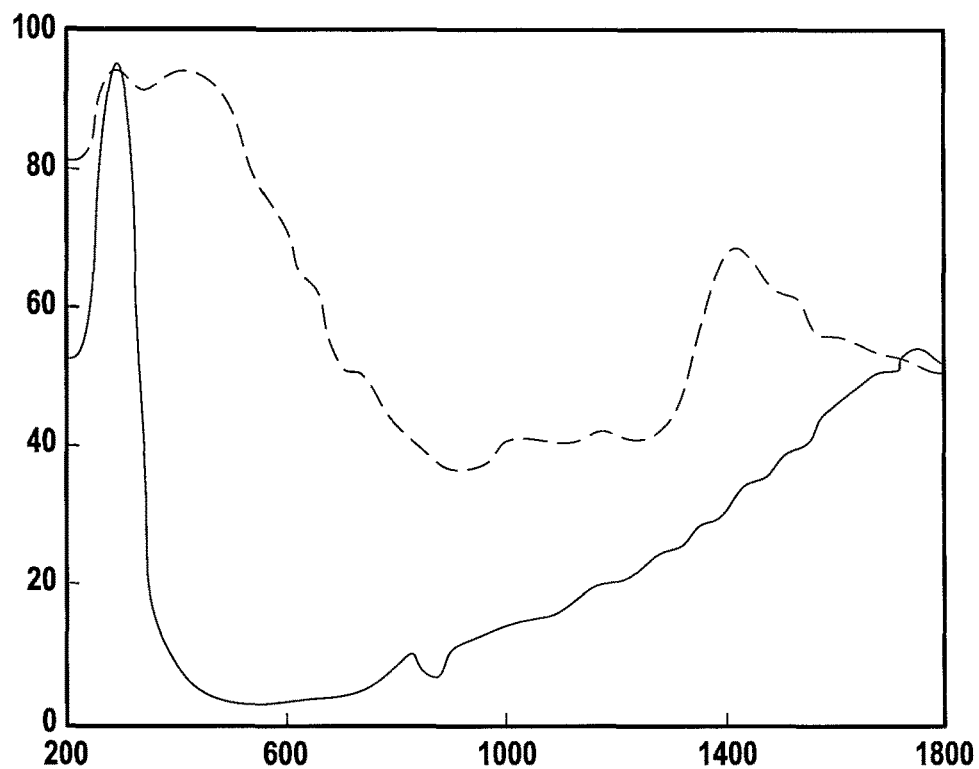
FIG. 3 shows a graph of the absorption (in %) as a function of the wavelength (in nm) for two different photodiodes.

FIG. 3 shows a graph of the absorption (in %) in function of the wavelength (in nm) for two different photodiodes, one without lead sulfide layer (solid line) and one with lead sulfide layer (dashed line). As can be seen, the addition of lead sulfide in the photodiode increases significantly the absorption throughout the infrared and visible range of light.

Figure 4:
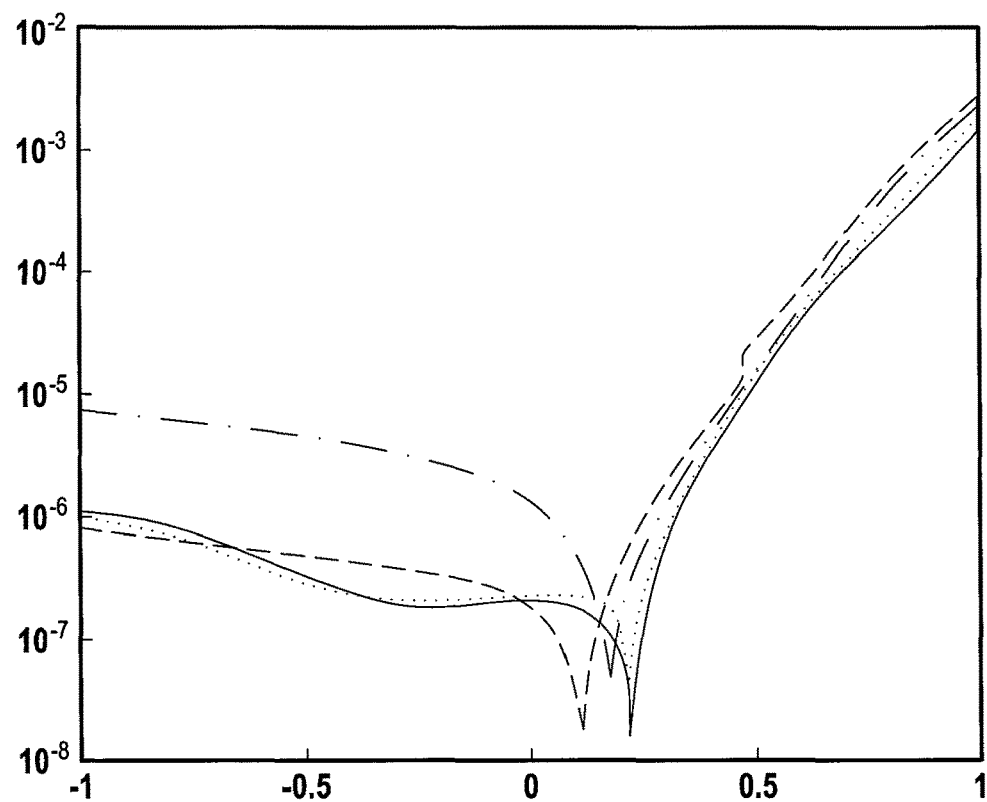
FIG. 4 shows a graph of the current density (in $A \cdot cm^{-2}$) as a function of the bias (in V) for two different photodiodes respectively in the dark and under 20 $mW \cdot cm^{-2}$ at 1530 nm illumination.

FIG. 4 shows a graph of the current density (in A·cm$^{-2}$) in function of the bias (in V) for the photodiode without lead sulfide respectively in the dark (solid line) and under 20 mW·cm$^{-2}$ at 1530 nm illumination (dotted line) and for the photodiode with lead sulfide respectively in the dark (dashed line) and under 20 mW·cm$^{-2}$ at 1530 nm illumination (mixed dashed and dotted line). As can be seen, the addition of lead sulfide in the photodiode increases significantly in the reverse-bias current density under illumination, whereas the current-voltage characteristic of the photodiode without lead sulfide remains relatively unchanged.

Figure 5A:
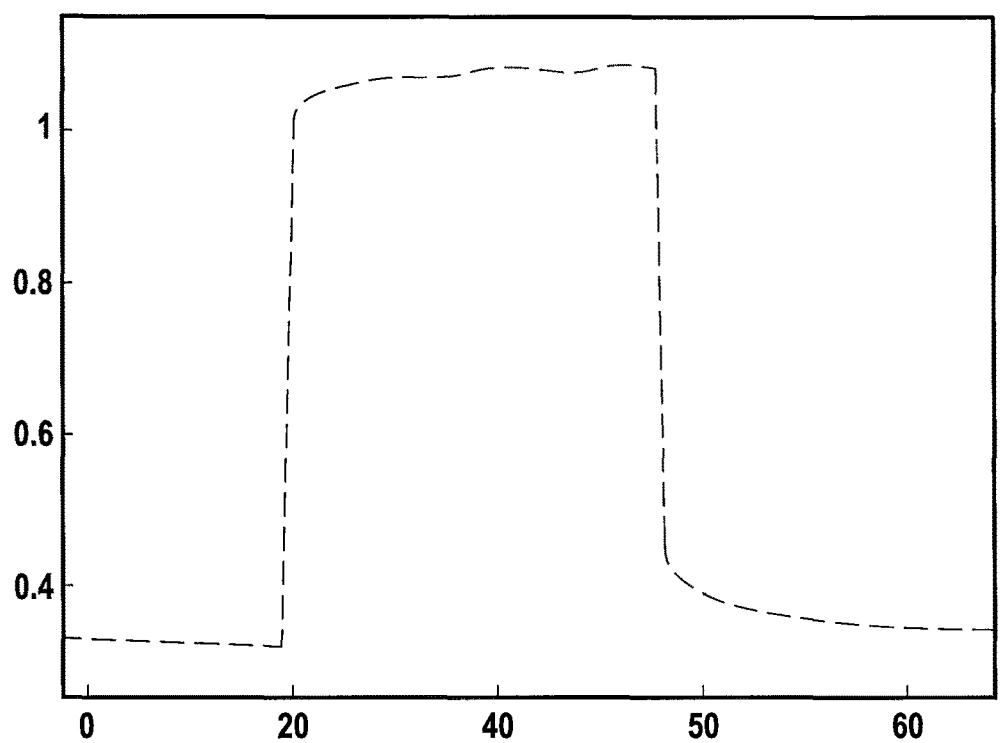
FIGS. 5A-5D show the responsivity and specific detectivity at 20 $mW \cdot cm^{-2}$ illumination for an exemplary photodiode according to embodiments of the disclosure.
Figure 5B:
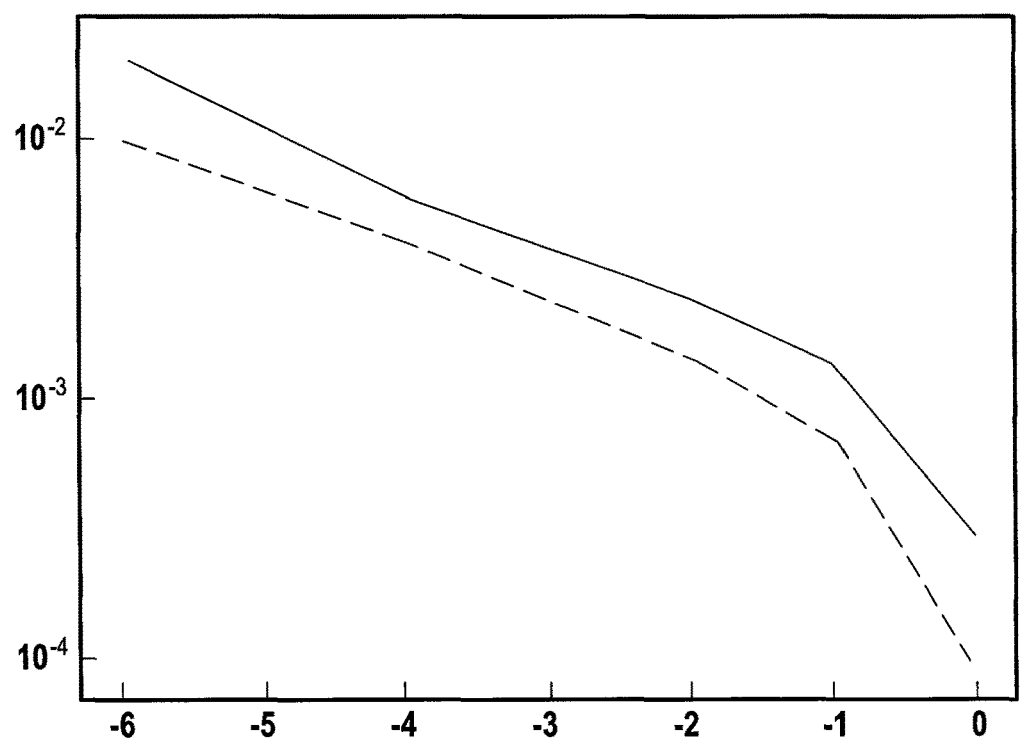
Figure 5C:
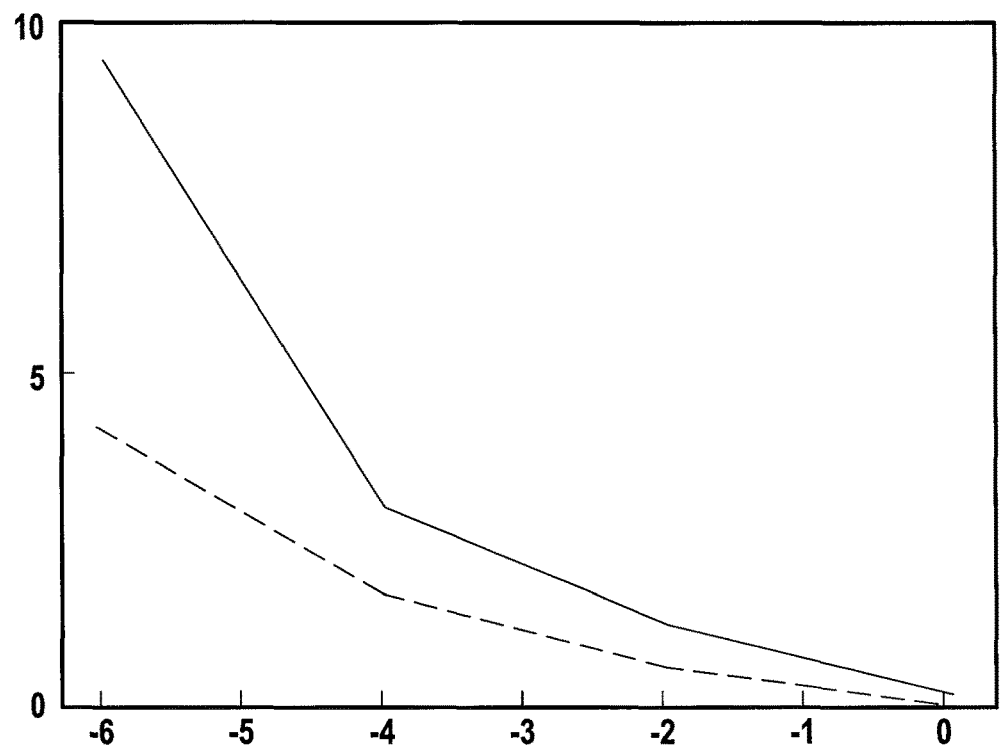
Figure 5D:
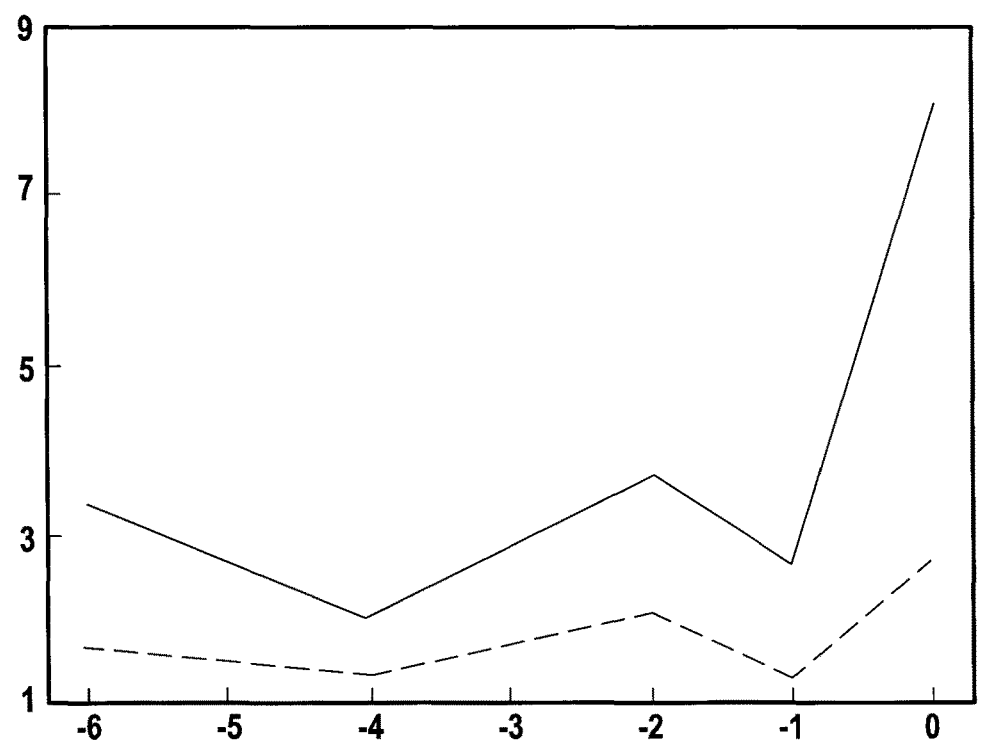

FIGS. 5A-5D show the responsivity and specific detectivity at 20 mW·cm$^{-2}$ illumination for a photodiode with lead sulfide. FIG. 5A shows the current (in A) as a function of the time (in ms) of a sample photocurrent transient at 1530 nm and −1 V bias. FIG. 5B shows the responsivity (in A·W$^{-1}$) as a function of the bias (in V) respectively at 830 nm (solid line) and 1530 nm (dashed line). FIG. 5C shows the internal quantum efficiency (in %) as a function of the bias (in V) respectively at 830 nm (solid line) and 1530 nm (dashed line). FIG. 5D shows the shot-derived specific detectivity×10$^9$ (in Jones) as a function of the bias (in V) respectively at 830 nm (solid line) and 1530 nm (dashed line).

Thus, the photodiode comprising a layer of lead sulfide can be used in many sensing applications. It can be used in applications with a broad spectral response from past 2000 nm down to visible wavelengths. For example, it can be used in receivers for telecommunications at 1500 nm which is a standardized wavelength for almost all telecom technologies. It can also be used in infrared sensing for gesture recognition which often operates in the 850-950 nm range or even in near-field communication devices.

Throughout the description, including the claims, the term "comprising a" should be understood as being synonymous with "comprising at least one" unless otherwise stated. In addition, any range set forth in the description, including the claims should be understood as including its end value(s) unless otherwise stated. Specific values for described elements should be understood to be within accepted manufacturing or industry tolerances known to one of skill in the art, and any use of the terms "substantially" and/or "approximately" and/or "generally" should be understood to mean falling within such accepted tolerances.

Although the present disclosure herein has been described with reference to particular embodiments, it is to be understood that these embodiments are merely illustrative of the principles and applications of the present disclosure.

It is intended that the specification and examples be considered as exemplary only, with a true scope of the disclosure being indicated by the following claims.

The invention claimed is:

1. A PIN type infrared photodiode comprising:
a first electrode,
a n-type semiconductor,
an atomic layer deposition coating containing lead sulfide,
a p-type semiconductor, and
a second electrode,
wherein:
a content of the lead sulfide in the atomic layer deposition coating is at least 95 wt %, and
the n-type semiconductor comprises nanowires conformally coated with the atomic layer deposition coating.

2. The PIN type infrared photodiode according to claim 1, wherein the nanowires comprises zinc oxide.

3. The PIN type infrared photodiode according to claim 1, further comprising a coating of titanium dioxide interposed between the nanowires and the atomic layer deposition coating, the coating of titanium dioxide conformally coating the nanowires.

4. The PIN type infrared photodiode according to claim 1, wherein the p-type semiconductor comprises spiro-MeOTAD.

5. The PIN type infrared photodiode according to claim 1, wherein the first electrode comprises fluorine-doped tin oxide.

6. The PIN type infrared photodiode according to claim 1, wherein the atomic layer deposition coating has a thickness equal to or greater than 5 nm.

7. The PIN type infrared photodiode according to claim 1, wherein the atomic layer deposition coating has a thickness less than or equal to 40 nm.

8. A method for producing a PIN type infrared photodiode, the method comprising:

growing nanowires of a n-type semiconductor; and
conformally coating the nanowires with lead sulfide by atomic layer deposition to form an atomic layer deposition coating containing lead sulfide, wherein a content of the lead sulfide in the atomic layer deposition coating is at least 95 wt %.

9. The method according to claim 8, further comprising:
before the nanowires are conformally coated with lead sulfide, conformally coating the nanowires with titanium dioxide by atomic layer deposition,
wherein the nanowires comprise zinc oxide.

10. The method according to claim 8, wherein the nanowires are grown on a fluorine-doped tin oxide substrate.

11. The method according to claim 8, wherein the lead sulfide is deposited from lead bis(2,2,6,6-tetramethyl-3,5-heptadionate) and hydrogen sulfide precursors.

12. The method according to claim 8, wherein a number of cycles for the deposition of the lead sulfide is equal to or greater than 10 cycles.

13. The method according to claim 8, wherein a number of cycles for the deposition of the lead sulfide is less than or equal to 110 cycles.

14. The method according to claim 8, wherein the nanowires are grown from a liquid solution at temperature below 600° C.

\* \* \* \* \*